United States Patent
Wang et al.

(10) Patent No.: US 8,232,824 B2
(45) Date of Patent: Jul. 31, 2012

(54) CLOCK CIRCUIT AND METHOD FOR PULSED LATCH CIRCUITS

(75) Inventors: Chung-Hsing Wang, Boashan Township (TW); Chih-Chieh Chen, Launtang Taoyuan (TW); Chih Sheng Tsai, Taichung (TW); Shu Yi Ying, Taichung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 273 days.

(21) Appl. No.: 12/688,741

(22) Filed: Jan. 15, 2010

(65) Prior Publication Data

US 2010/0259308 A1    Oct. 14, 2010

Related U.S. Application Data

(60) Provisional application No. 61/167,694, filed on Apr. 8, 2009.

(51) Int. Cl.
*H03K 3/017* (2006.01)
(52) U.S. Cl. .................. 327/175; 327/172
(58) Field of Classification Search .......... None
See application file for complete search history.

(56) References Cited

U.S. PATENT DOCUMENTS

| | | | | |
|---|---|---|---|---|
| 4,338,932 A | * | 7/1982 | Georgi et al. | 604/28 |
| 6,107,850 A | * | 8/2000 | Shimizu | 327/172 |
| 7,694,242 B1 | * | 4/2010 | Li et al. | 716/100 |

FOREIGN PATENT DOCUMENTS

WO    WO 2004038917 A1 *  5/2004

OTHER PUBLICATIONS

Tschanz, J., et al., "Comparative Delay and Energy of Single Edge-Triggered & Dual Edge-Triggered Pulsed Flip-Flops for High-Performance Microprocessors", International Symposium on Low Power Electronics and Design, Aug. 6-7, 2001, pp. 147-152.

* cited by examiner

*Primary Examiner* — Cassandra Cox
(74) *Attorney, Agent, or Firm* — Slater & Matsil, L.L.P.

(57) ABSTRACT

Circuits and methods for providing a pulsed clock signal for use with pulsed latch circuits are described. A variable pulse generator is coupled to form a pulsed clock output responsive to a control signal and a clock input signal. A feedback loop is provided with a pulse monitor and a pulse control circuit. Samples of the pulsed clock signal are taken by the pulse monitor and an output is formed in the form of a pattern. The pulse control circuit receives the output of the monitor and determines whether it matches a predetermined pattern. Adjustments are made to the control signal to adaptively adjust the pulsed clock signal. The feedback loop may operate continuously. In alternative embodiments the feedback loop may be powered down. Methods for adaptively controlling a pulsed clock signal are disclosed.

19 Claims, 12 Drawing Sheets

CLOCK CIRCUIT AND METHOD FOR PULSED LATCH CIRCUITS

This application claims the benefit of U.S. Provisional Application No. 61/167,694, entitled "Clock Circuit and Method for Pulsed Latch Circuits," filed on Apr. 8, 2009, which is incorporated herein by reference.

TECHNICAL FIELD

The present invention relates to a circuit and methods for providing an improved clock circuit and method for providing a pulsed clock signal which is needed for the use of pulsed latch circuits in integrated circuit devices. The invention provides advantages in a circuit that provides a pulsed clock signal at a specified duty cycle that is periodically monitored and automatically adjusted for variations due to temperature, process or load variations.

BACKGROUND

A common requirement for an electronic circuit and particularly for electronic circuits manufactured as integrated circuits in semiconductor processes is a storage element, such as a register. Often so called edge triggered registers ("flip flops") are used. In these circuits, pairs of latch elements are serially coupled back to back and are clocked by a constant duty cycle clock. The front latch is opened on a rising pulse of the clock signal, while the second latch, which provides the output signal, is opened during a rising edge of an inverted clock signal. The result is that the edge triggered flip flop has a stable output for the majority of each clock cycle, making use of the outputs in combinatorial logic between clocked registers fairly easy as the critical path in logical circuitry can reliably use the "Q" or inverted "Q" or "Q_" outputs for most of the clock cycle without any timing problems.

However, these edge triggered flip flop registers require several transistors, consume significant silicon area, and consume significant power. The power consumption problem is further increased by the consumption of power even when the input to the stage has not changed, for example when the register is not in active use by the system. Each time a clock edge arrives, transistors in the circuit change state and thus use power—even for cycles where the input is stable and/or the output is not being used.

Various approaches to reducing the power consumption in integrated circuits have been proposed. Clock gating approaches provide a clock signal to portions of an integrated circuit (or other circuitry, for that matter) which is not allowed to transition when the circuit is not in use. The clock is then gated by an enable signal. This approach can save power but adds additional logic circuitry, control circuitry, and signal routing requirements to form and route the gated clock signals to the registers in place of the clock signals.

Another approach is to form power gating circuitry. Power gating circuitry includes logic and control circuitry to remove the power signals to portions of the integrated circuit, and in particular to registered elements when they are not in use. Again, this approach requires additional logic and control circuitry and routing various signals to portions of the integrated circuit. One advantage that power gating achieves over clock gating is that it conserves both dynamic power (power consumed due to clock switching) and standby or static power (power consumed to maintain state of the registers in the absence of clock switching).

Some other known approaches use frequency compensation to reduce dynamic power consumption. In this approach, the clock signals are reduced in frequency when possible to reduce the number of switching cycles over a time interval and thereby reduce the consumption of dynamic power. Again, additional control and logic circuitry are needed.

In some circuits, some reduction in power consumption is possible by reducing the voltage level of the positive supply slightly to portions of a circuit; however, this approach also requires added circuitry and added routing channels, and reduces the signal margins of the circuit, which can impose additional constraints or risks on the design process.

Recently, the attempt to reduce power consumption has resulted in the use of "pulsed latch" circuits instead of register circuits for storage. In this approach, a latch circuit, which has approximately half of the transistors and silicon area requirements of a registered flip flop, is used with a pulsed clock to open the latch and close it. By reducing the duty cycle of the pulsed clock, the input is sampled for a portion of the clock cycle, but then the latch closes and the output remains constant for the remainder of the clock cycle. In a paper presented by Tschanz, et al. in 2001 entitled "Comparative Delay and Energy of Single Edge-Triggered and Dual Edge-Triggered Pulsed Flip-Flops for High Performance Microprocessors", power usage and delay characteristics were compared for several differing pulsed clock latches and flip-flops. In applications where power savings is the primary concern, one particular pulsed latch circuit, which in the paper is referred to as "explicit pulsed hybrid static flip-flop" or EP-SFF was shown to be superior. In addition, it is possible for the pulsed clock signal to be shared among several of these pulsed latch circuits and additional power and area savings can therefore be achieved.

FIG. 1 depicts a simple circuit diagram of a prior art pulsed latch circuit such as referred to in the Tschanz reference. In FIG. 1, an input transmission gate comprised of transistors MN1 and MP1 samples or receives a data input when the pulsed clock signal "PCLK" is active. Inverters I5 and I6 form a recirculating latch, which will recirculate the data in the latch unless that data is overwritten by new incoming data, as is known in the art. Output driver inverter OUTB will then provide the output Q_.

Inverter I4 provides PCLK from the output of NAND GATE N1. Inverters I1, I2, I3 and NAND gate N1 form a clock pulse generator circuit that, at a falling edge of the clock signal CLK, will generate a "zero" pulse on PCLK_ that is only the width of the delay provided by the inverting delay chain of inverters I1 and I2, I3. Thus, by increasing or decreasing the length of the delay line, the pulse width may be varied but is fixed at a designed delay time. Variations in the device performance caused by, for example, operating temperature or process variation effects, will change the delay obtained and thus the pulse clock PCLK_ operation.

If the high portion of the pulse on pulsed clock signals PCLK/PCLK is too long, then the latch may capture data too early and cause a "flash through" timing problem, that is, in a counter or shift register circuit the pulse latch register may skip a clock cycle, resulting in erroneous operation. On the other hand, if the pulse becomes too short, the register may not have the input gates MN1 and MP1 open for a time long enough to change the internal stored value, thus the input data could be missed and not captured.

FIGS. 2(a), 2(b) and 2(c) depict in three schematic views variations on the prior art pulsed clock circuit that are used. All of these circuits will output a pulsed clock from a time varying clock signal input. Typically, the time varying clock has a 50% duty cycle and the pulsed clock signal has a duty cycle of 10-30%, that is, the high part of the pulsed clock duty cycle is shorter than the rest. In FIG. 2(a), the circuit used in the prior art pulse latch of FIG. 1 is depicted. FIG. 2(b) illustrates an alternative circuit arrangement that uses additional pull up and pull down devices MP1 and MN1 to improve the performance. FIG. 2(c) depicts an alternative arrangement similar to FIG. 2(c) but incorporating a scan path input SE for clocking the pulsed latch during test or other scan operations as is known in the art.

The prior art pulse clock generators of FIG. 2 may be designed for different delay lengths by changing the devices used such as MP1 and MN1 or the number and size of the inverters used, however, after the integrated circuit device containing the pulsed latch is completed, temperature dependent or process dependent effects may undesirably change the pulse width obtained on the pulsed clock output. This change in pulse width may negatively affect the operation of the circuits and/or the yield of a fabrication facility.

Thus, there is a continuing need for a pulsed clock circuit and methods that provide a pulsed clock signal for use with pulsed latch circuitry. The pulsed clock signal has a desired pulse width that is maintained more or less constant, in spite of variations in temperature and process related circuit variations, is adapted to changes in conditions, and the circuit and methods should remain compatible with existing and future semiconductor processes for fabricating integrated circuits.

SUMMARY OF THE INVENTION

These and other problems are generally solved or circumvented, and technical advantages are generally achieved, by embodiments of the present invention, which provides a variable pulse generator coupled to form a pulsed clock output responsive to a control signal and a clock input signal. A feedback loop is provided with a pulse monitor and a pulse control circuit. Adjustments are made to the control signal to adaptively adjust the pulsed clock signal. The feedback loop may operate continuously. In alternative embodiments, the feedback loop may be powered down.

In an exemplary embodiment, an apparatus is provided comprising a variable pulse generator for outputting a pulsed clock having a desired duty cycle responsive to an input clock signal, and having a control input, a pulse monitor circuit for outputting a monitor output corresponding to a timing relationship between the input clock signal and the pulsed clock signal, and a pulse width control circuit coupled to receive the monitor output, and outputting the control signal in response to the pattern on the monitor output.

In another exemplary embodiment, an apparatus is provided comprising an integrated circuit having logic circuitry coupled to perform a user defined logic function; at least one pulsed latch circuit coupled to the logic circuitry and configured to store a value responsive to a pulsed clock signal; and a pulsed clock generator for outputting the pulsed clock signal responsive to an input clock signal. The pulsed clock generator is operable to adaptively compensate the pulsed clock signal to maintain a desired duty cycle using a feedback loop comprising a pulse monitor circuit that outputs a monitor output, and a pulse control circuit operable to control the width of the pulsed clock signal responsive to the monitor output.

In another exemplary embodiment a method is provided, comprising receiving an input clock signal; outputting a pulsed clock signal responsive to the input clock signal, having a pulse width corresponding to a control signal; forming a plurality of delayed pulsed clock signals; sampling the input clock with the delayed pulsed clock signals to form a monitor output; comparing the monitor output to a desired monitor output; and adjusting the control signal if the monitor output does not match the desired monitor output.

This summary gives an overview of certain embodiments of the invention, and is not limiting. Additional features and advantages of the invention will be described hereinafter, which form the subject of the claims of the invention. It should be appreciated by those skilled in the art that the conception and specific embodiment disclosed might be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE FIGURES

For a more complete understanding of the present invention, and the advantages thereof, reference is now made to the following descriptions taken in conjunction with the accompanying drawings, in which.

The drawings, schematics and diagrams are illustrative and not intended to be limiting, but are examples of embodiments of the invention, are simplified for explanatory purposes, and are not drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
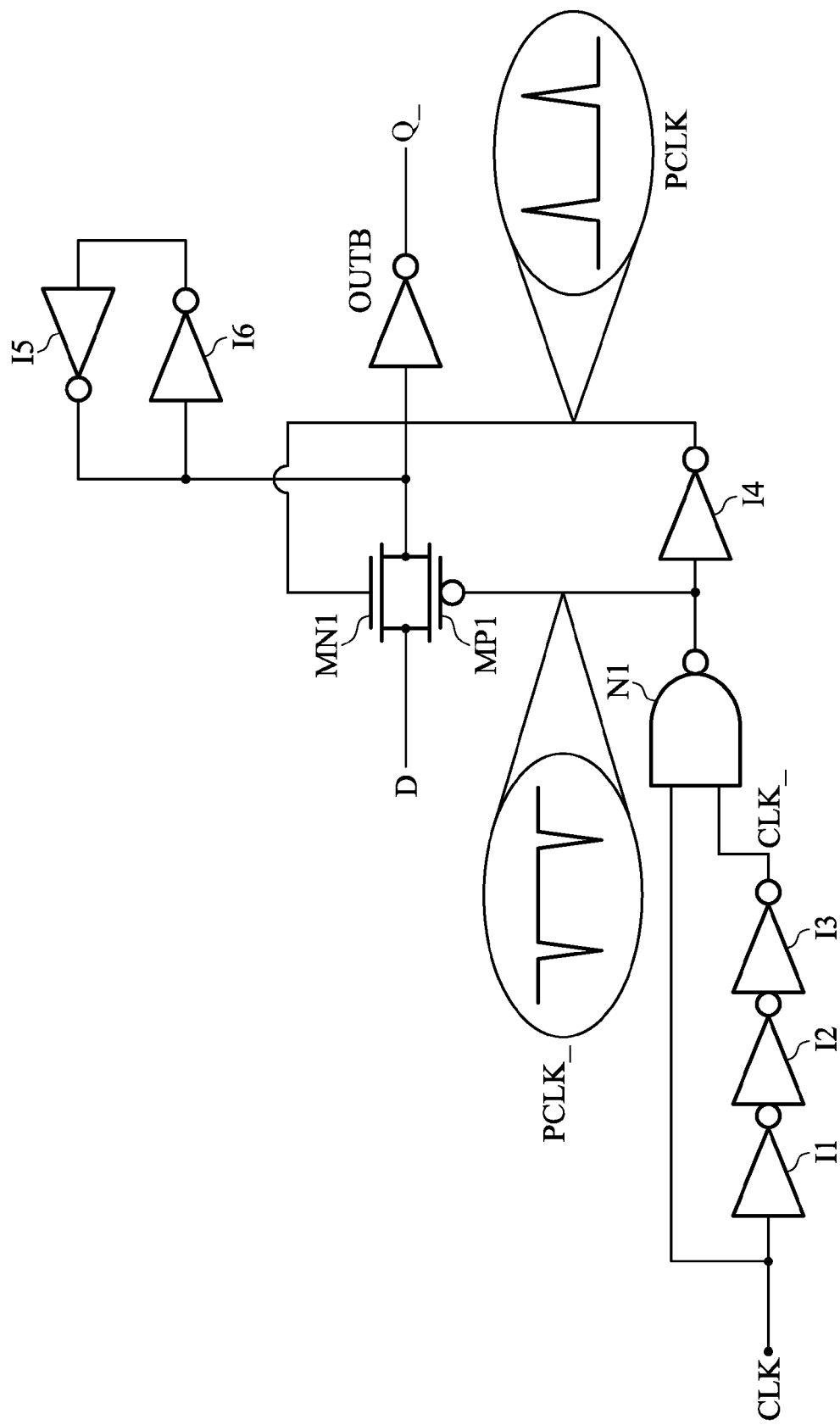
FIG. 1 illustrates a prior art pulsed latch circuit of the prior art.
Figure 2A:
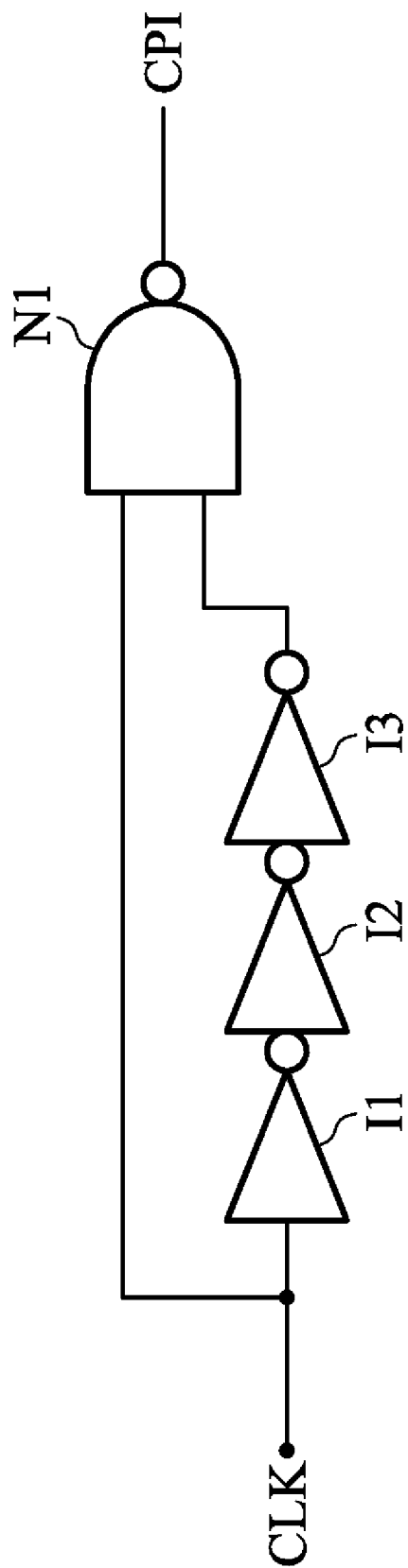
FIG. 2(a) depicts a prior art circuit for forming a pulsed clock.
Figure 2B:
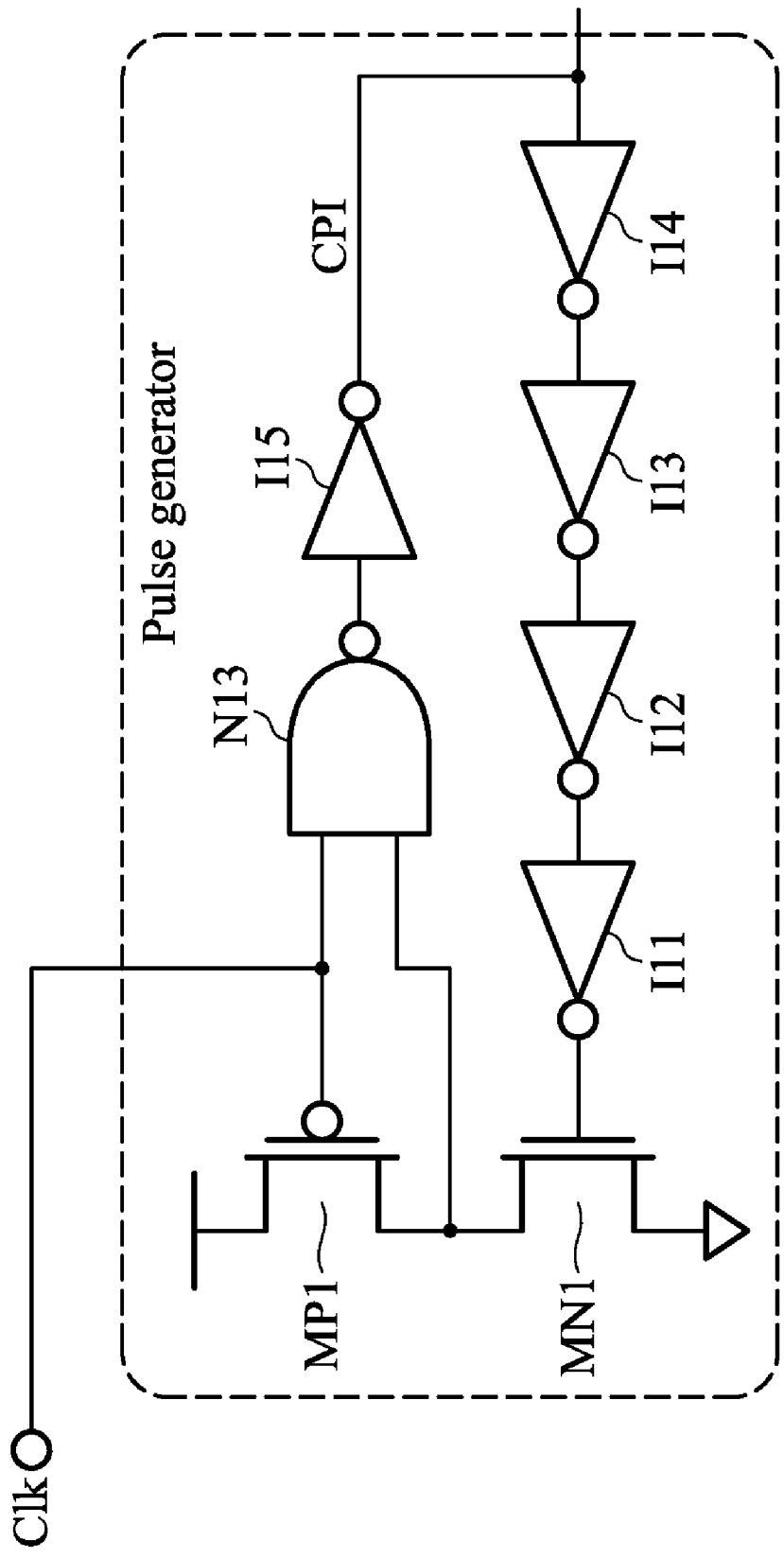
FIG. 2(b) depicts an alternate prior art circuit for forming a pulsed clock.
Figure 2C:
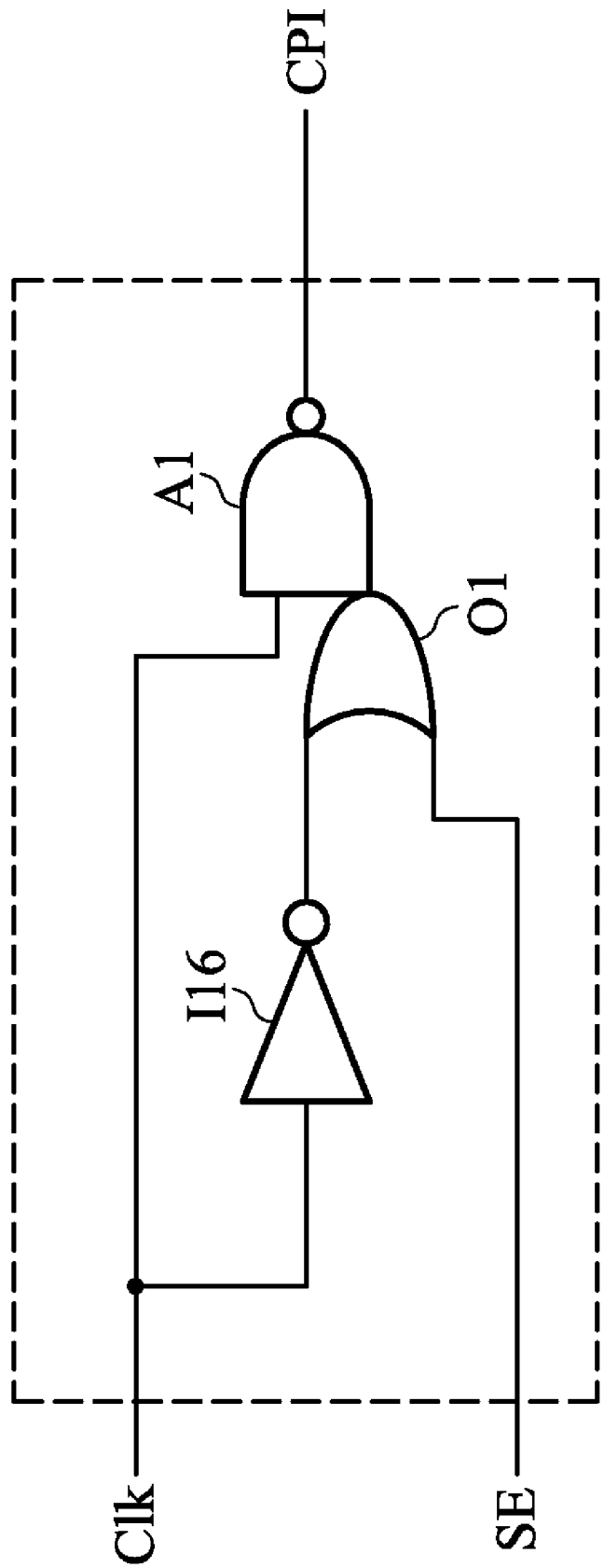
FIG. 2(c) depicts another alternate prior art circuit for forming a pulsed clock.
Figure 3:
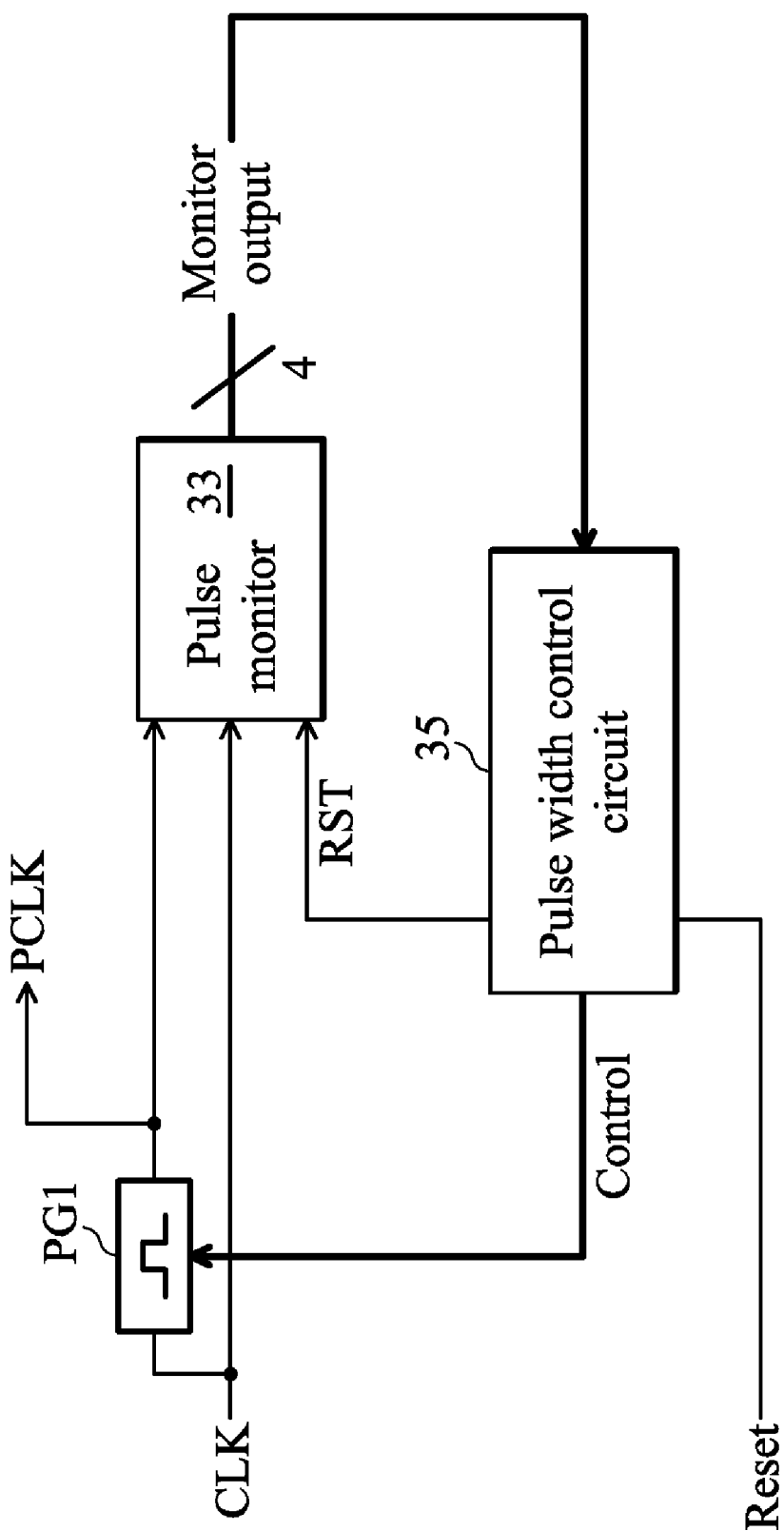
FIG. 3 illustrates in a block diagram view an exemplary embodiment of the present invention.

FIG. 3 depicts in one exemplary embodiment a block diagram of a pulse generator circuit 31 of the invention with a feedback control loop. In FIG. 3, a time varying CLK input signal is received. The input clock may be, in a typical application, a 50% duty cycle square wave signal. The variable pulse generator PG1 receives the clock input signal CLK and outputs a pulsed clock signal PCLK. The pulsed clock signal typically will have a shorter positive portion of its duty cycle, for example, 10-30%, and ranging up to 40% or so. The width of the pulse provided is controlled by the control input to PG1. A pulsed clock generator circuit such as that shown in FIG. 2(a) can be used, where the number of delay elements coupled in series is modified corresponding to the control input, for example.

The output PCLK is used for several pulse latch circuits (not visible) and also is an input to the pulse monitor 33. The clock input signal is also fed as an input to the pulse monitor circuit 33. Finally, a reset control signal is input to the pulse monitor circuit 33.

FIG. 3 also depicts a feedback control loop. The monitor output of the pulse monitor circuit, which is shown in this non-limiting example as 4 bits, but which could be more, such as 6 or 8 bits, or fewer, such as 2 bits, indicates in a pattern how closely the PCLK duty cycle fits a desired duty cycle. The pulse width control circuit 35 can adaptively modify the pulse width of PCLK in a recursive fashion until the desired pulse clock duty cycle is observed on the PCLK signal. In this manner, the circuit can compensate for temperature dependent effects, process variations, and any other changes in the pulse width due to power supply variation, and the like.

In operation, the pulse width control circuit 35 will start operation with the control output at an initial setting. Then, as the pulse monitor 33 begins outputting the multiple bit monitor output pattern, the control circuit 35 may modify the control signals until the desired duty cycle on the output PCLK is observed. In some embodiments, the pulse monitor circuit 33 and the pulse width control circuit 35 will continue to adaptively monitor and adjust the pulse width. In an alternative method embodiment, once the output of the pulse monitor 33 remains constant for a predetermined number of clock cycles, the power may be turned off to the pulse monitor 33 and the pulse width control circuit 35. This power gating technique saves power consumption. Periodically, the circuits could be re-enabled, following a reset, or after some time elapses in a system, to re-adjust the pulse width.

Figure 4:
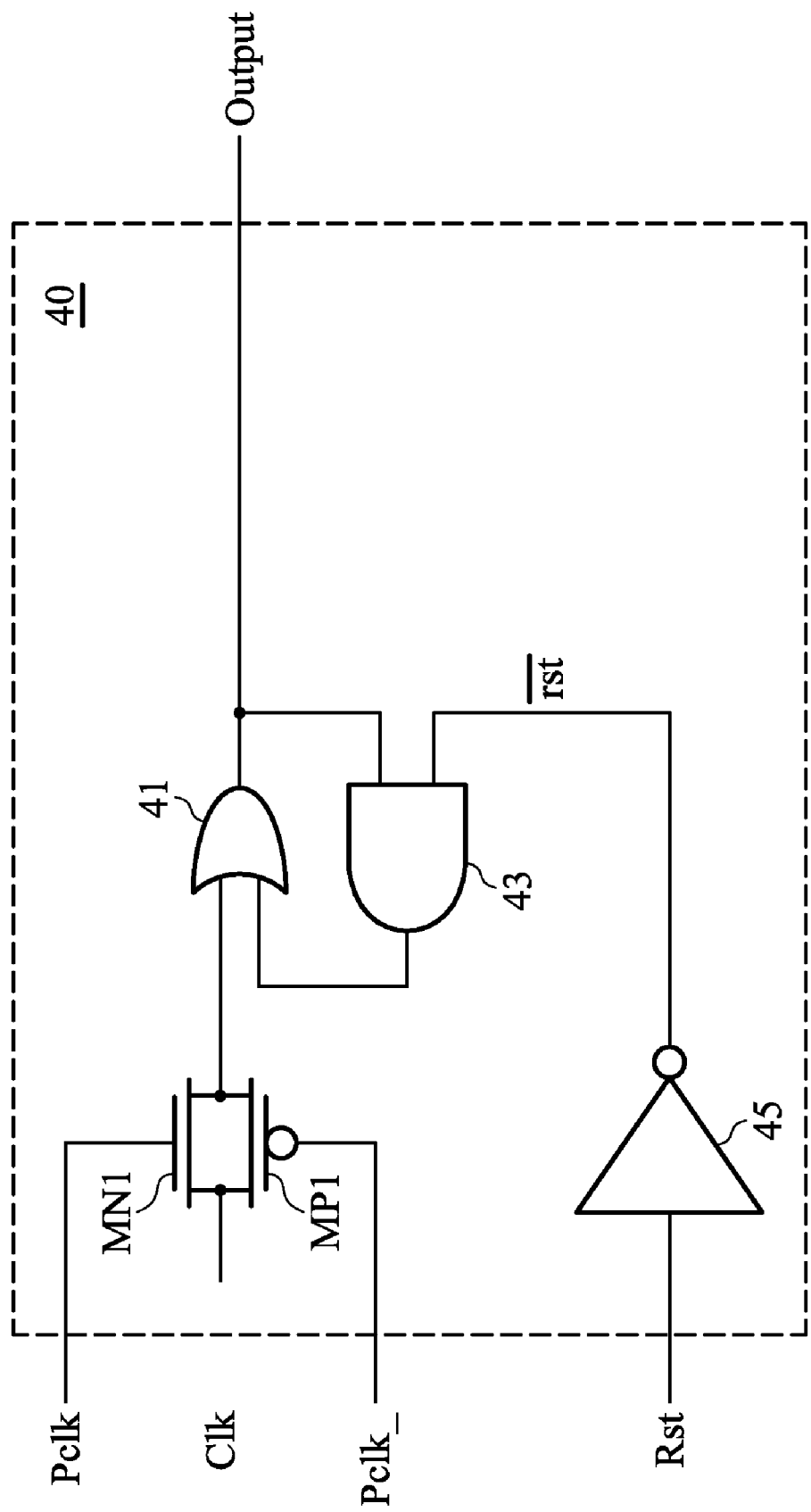
FIG. 4 illustrates in a simplified circuit schematic a pulse sensor embodiment for use in the present invention.

FIG. 4 illustrates a circuit schematic of an exemplary embodiment pulse sensor circuit 40 that may be used to implement the pulse monitor 33 of FIG. 3. In FIG. 4, transmission gate transistors MN1 and MP1 are coupled to the input clock or a version of the input clock as a data input, and the transmission gate transistors sample the clock signal when the pulsed clock PCLK is high. Logic gate 41, an OR gate in this non-limiting example circuit, and logic gate 43, an AND gate in this example, form a latch to hold the output until the next sample overwrites the stored value in the hold latch formed by the recirculating path from the output signal through logic gates 43 and 41. The reset input Rst will force the output signal to a zero condition by the action of inverter 45 forcing the output of AND gate 43 to a zero, so the pulse sensor will restart from a known state.

Figure 5:
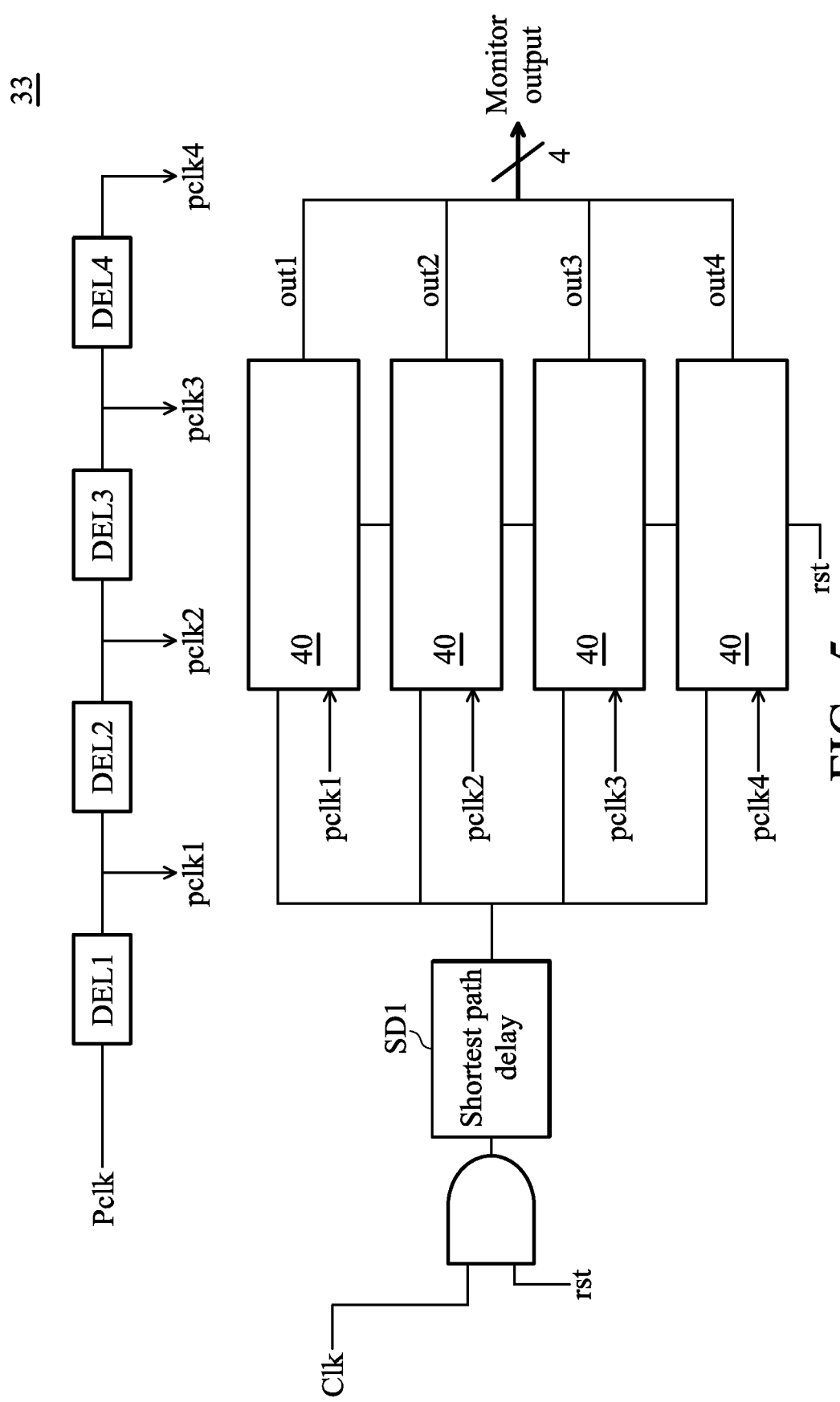
FIG. 5 illustrates in a simplified circuit schematic view a pulse monitor embodiment for use in the present invention.

FIG. 5 depicts in an exemplary embodiment an implementation of the pulse monitor circuit 33 of FIG. 3 which outputs a multiple bit monitor output field. The monitor output field is a pattern of "1"s and "0"s that indicate the relationship between the pulse clock PCLK pulse width and the original clock signal. By comparing this pattern to a desired pattern, the pulse width control circuit 35 of FIG. 3 can adjust the variable pulse generator to adaptively control the PCLK signal.

The reset signal in FIG. 5 will set the Clk input to zero and this zero signal will be transmitted to the OR gate 41 in FIG. 4 through MN1 and MP1 in FIG. 4. With the reset signal in FIG. 4, this operation resets the output of OR gate 41.

Pulse sensor circuit 40 of FIG. 4 is used four times in parallel to form the outputs out1, out2, out3, and out4 that make up the monitor output. A series delay line with delay elements DEL1, DEL2, DEL3, and DEL4 form delayed versions of the PCLK signal pclk1, pclk2, pclk3, and pclk4. Each of these delayed pulse clocks is input into a corresponding one of the pulse sensors 40. The original clock signal CLK is delayed by a delay line equal to the shortest path delay in the critical path in the design. This delay, SD1, is equal to the delay from the clock signal Clk to the closest register in the critical path in the circuit (not shown). The pulse sensors 40 then each sample the delayed clock signal, as would be seen by a register in the design, by one of the four delayed pclk signals pclk1, pclk2, pclk3, and pclk4. In this manner, the relative timing of the two signals, CLK and PCLK, can be observed as a pattern.

Figure 6:
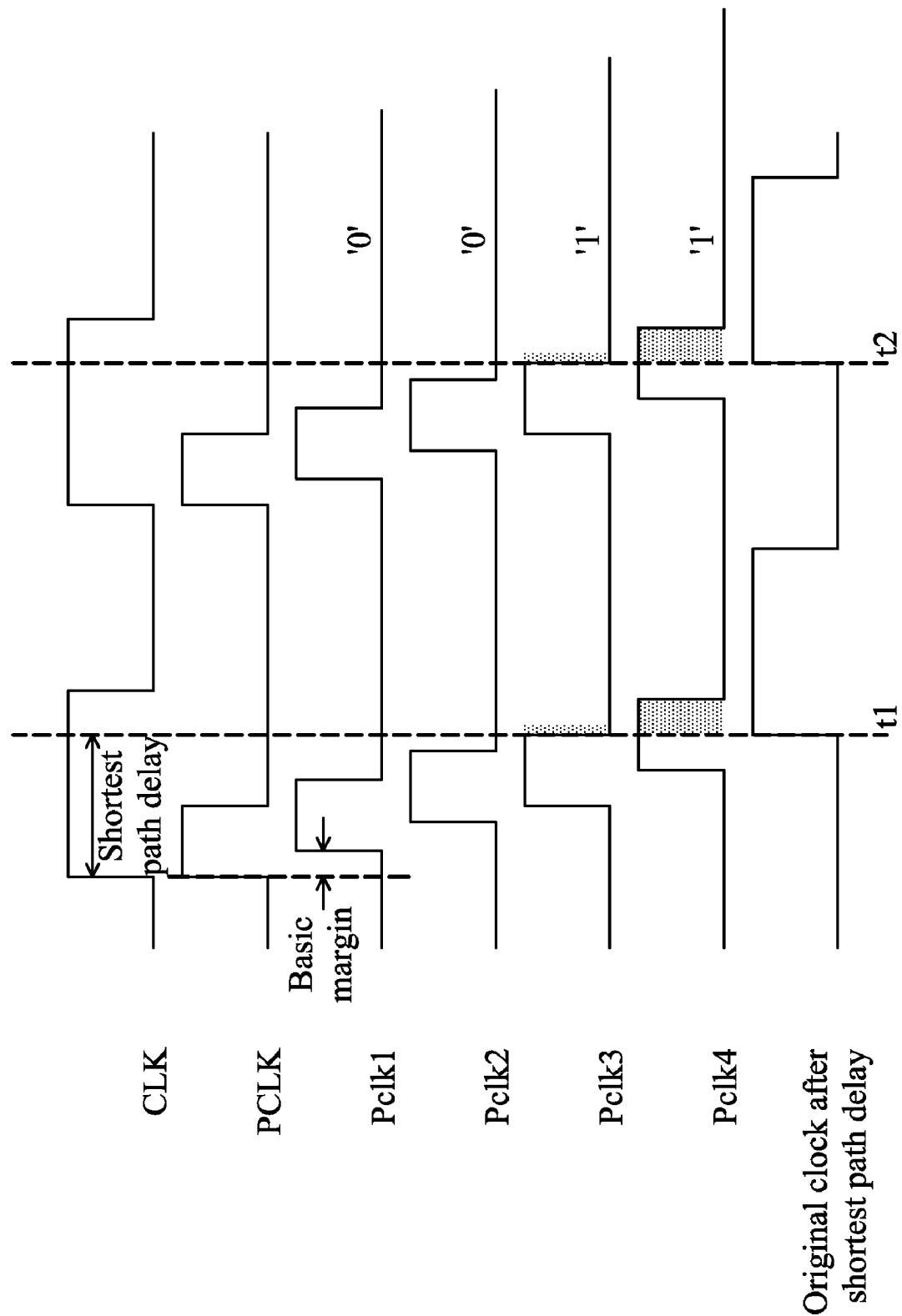
FIG. 6 illustrates in a timing diagram the operation of the pulse monitor embodiment of FIG. 5.

FIG. 6 depicts a timing diagram that illustrates the operation of the pulse monitor 33. In FIG. 6, the original clock source CLK is shown as the top trace. At the bottom trace, the CLK signal is shown after the delay provided by the shortest path delay SD1 of FIG. 5. The pulse clock generated by the variable pulse clock generator, PCLK, is shown as the second trace. The four traces labeled pclk1, pclk2, pclk3 and pclk4 that follow illustrate the timing for the delayed pulses that input to the pulse sensors. The output value for the example shown on the monitor output is '0011' at both times t1 and t2 in the diagram, as indicated by the shading on the timing diagram for the '1's. This means that the pulse clock width is such that the third delayed signal, pclk3, arrives in time to cause the pulse sensor circuit that outputs 'out3' in FIG. 5 to see the clock edge at the bottom trace, and the fourth delayed clock signal pclk4 arrives in time for the fourth output signal 'out4' to be a positive value, as the fourth sensor circuit also sees the high portion of the delayed clock signal.

In a system application, it is known to be advantageous to arrange the duty cycle for the pulsed clock signals used for pulsed latch circuits so that the high portion is as long as possible, without violating the hold time requirements. By keeping PCLK high as long as possible after the clock signal goes HIGH, the circuit may "borrow" logic operation time from the previous cycle. If the clock PCLK is high too long, the pulsed latch registers may see the value they should sample on the next cycle early (causing "flash through") and therefore, operate incorrectly. There is a design tradeoff between the desire for keeping the input latches open as long as possible in the pulsed latches and the need to drop the PCLK signals to latch the inputs to the output values correctly.

In some cases, the circuit of FIG. 5 may require modifications. In a case where the shortest path delay SD1 is too long, a second pulse generator PG2 is used to generate the signal that is input to the pulse sensors 40. This is necessary because in a particular application where the shortest path delay is long, the CLK input needs to be shortened to a pulse for the pulse sensors 40 to receive it correctly. Thus, in the operation of the circuit embodiment presented in FIG. 7, the pulse sensors sample a pulse corresponding to the CLK input with the delayed PCLK signals pclk1, pclk2, pclk3, and pclk4. The outputs out1, out2, out3, and out4 therefore form a pattern that may be used by the pulse monitor control circuit to adaptively adjust the pulse clock signal PCLK.

Figure 7:
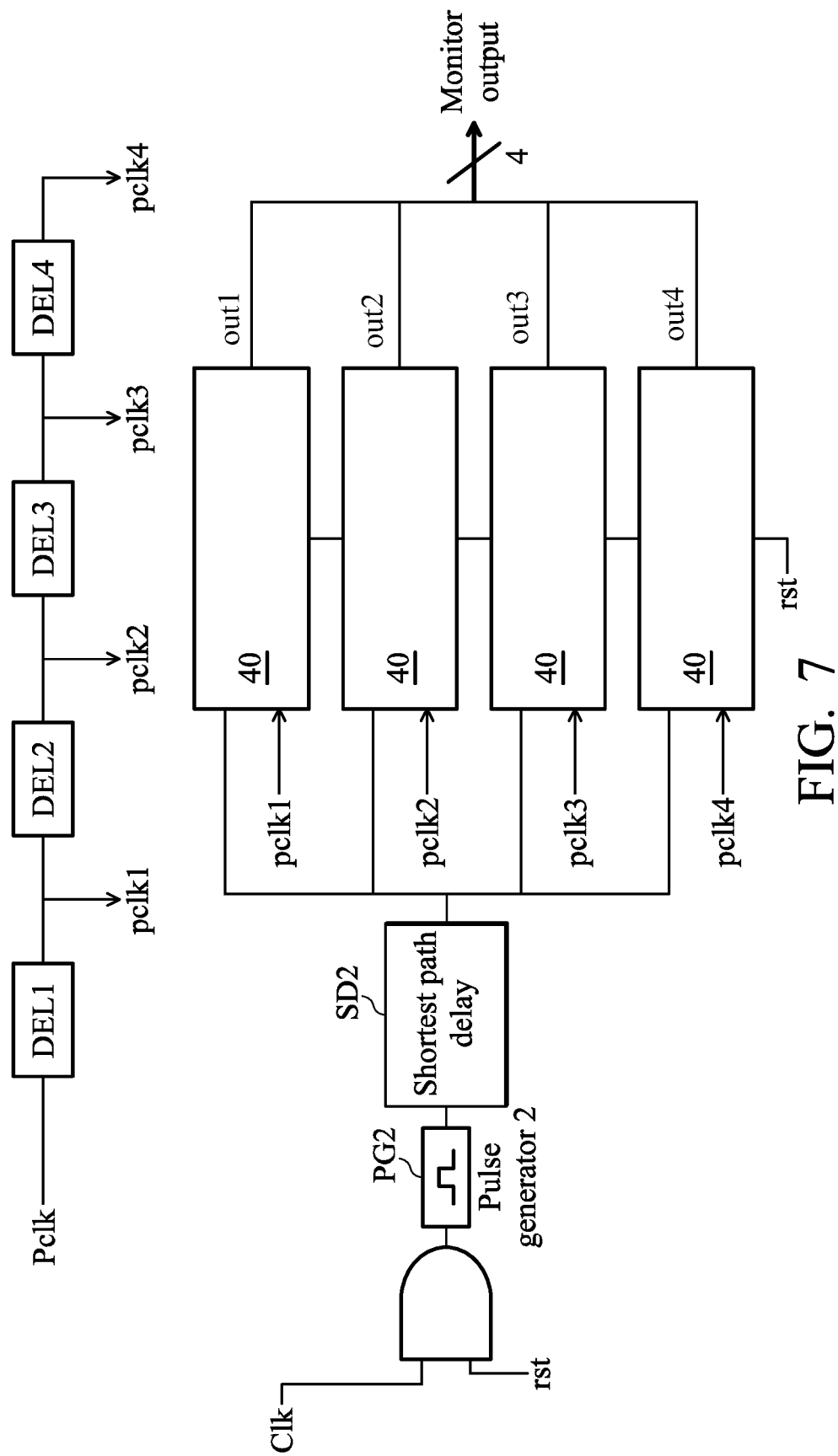
FIG. 7 illustrates in a simplified schematic view an alternate embodiment pulse monitor circuit for use with the invention.
Figure 8:
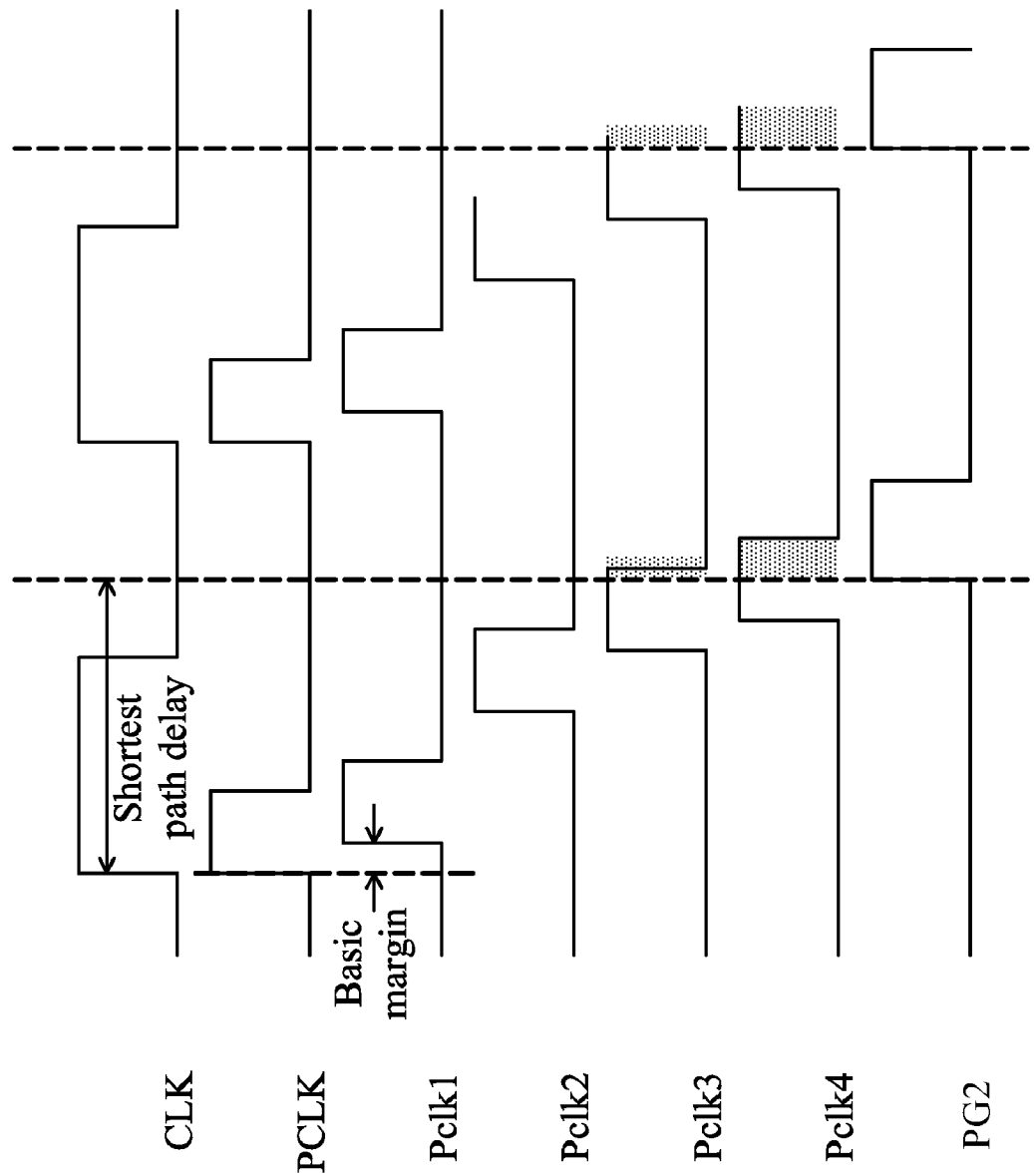
FIG. 8 depicts in a timing diagram the operation of the circuit of FIG. 7.

FIG. 8 is a timing diagram illustrating the operation of the circuitry of FIG. 7. This figure is very similar to FIG. 6, except that the bottom trace is a pulse generated by pulse generator PG2 and then delayed, instead of a delayed CLK signal. Again, the monitor output is a multiple bit (here, for example, four bits) pattern. This pattern again indicates the relative timing relationship between the PCLK pulsed clock signal generated in FIG. 3 and the CLK input signal, after the shortest path delay SD2.

There are several advantages of the use of the embodiments described above. The use of pulsed latches instead of master slave registers or flip flops, which is desirable, is enhanced by the embodiments of the invention which provide a pulsed clock signal that may drive a plurality of pulse latches. In contrast to the prior art circuits and methods, the pulsed clock signal generated by the embodiments is automatically calibrated using adaptive feedback circuitry in the form of a pulse monitor circuit and a pulse control circuit. Changes in the pulse width due to temperature variations, process dependent variations and power variations are therefore automatically compensated for and the circuitry continues to work reliably over a range of operating conditions. The pulse monitor and pulse control circuitry can be arranged to be powered down after the pulse clock signal PCLK is properly calibrated. Alternatively, the circuitry can be enabled to either periodically or continuously monitor the pulse width and adapt it.

Figure 9:
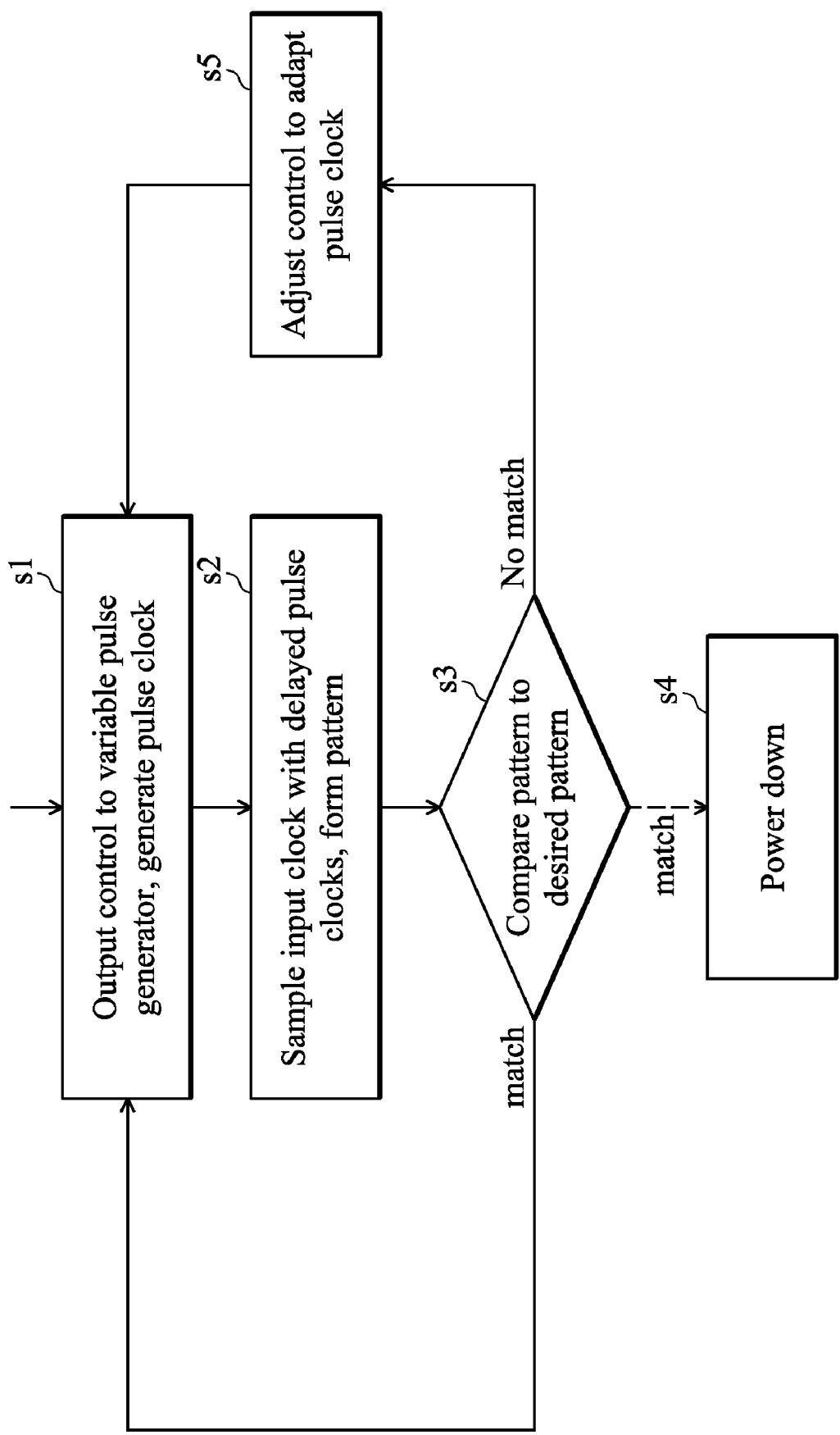
FIG. 9 illustrates a flow diagram for a method embodiment of the present invention.

FIG. 9 depicts in a flow diagram an exemplary method embodiment for providing a pulsed clock signal in response to a clock input signal. In FIG. 9, the flow chart is entered at the top following a reset or power up and the control is output to the variable pulse generator to generate a pulse clock in step s1. In step s2, the input clock is sampled with delayed pulse clocks to form a pattern. This pattern corresponds to the relative timing relationships between the pulse clock and the input clock signals. In step s3, the patterns are compared.

If the patterns do not match, the control is adjusted in step s5 and the method returns to step s1. If the patterns do match, in one typical embodiment where the pulse control circuit is left enabled for all of the operations, the method returns to step s1 and begins again. Alternatively, as illustrated by the dashed line, in some embodiments, the pulse monitor circuit may be powered down, as shown in step s4. As additional possible alternatives, the method may start again in step s1 after a period of time elapses, or after a reset.

Figure 10:
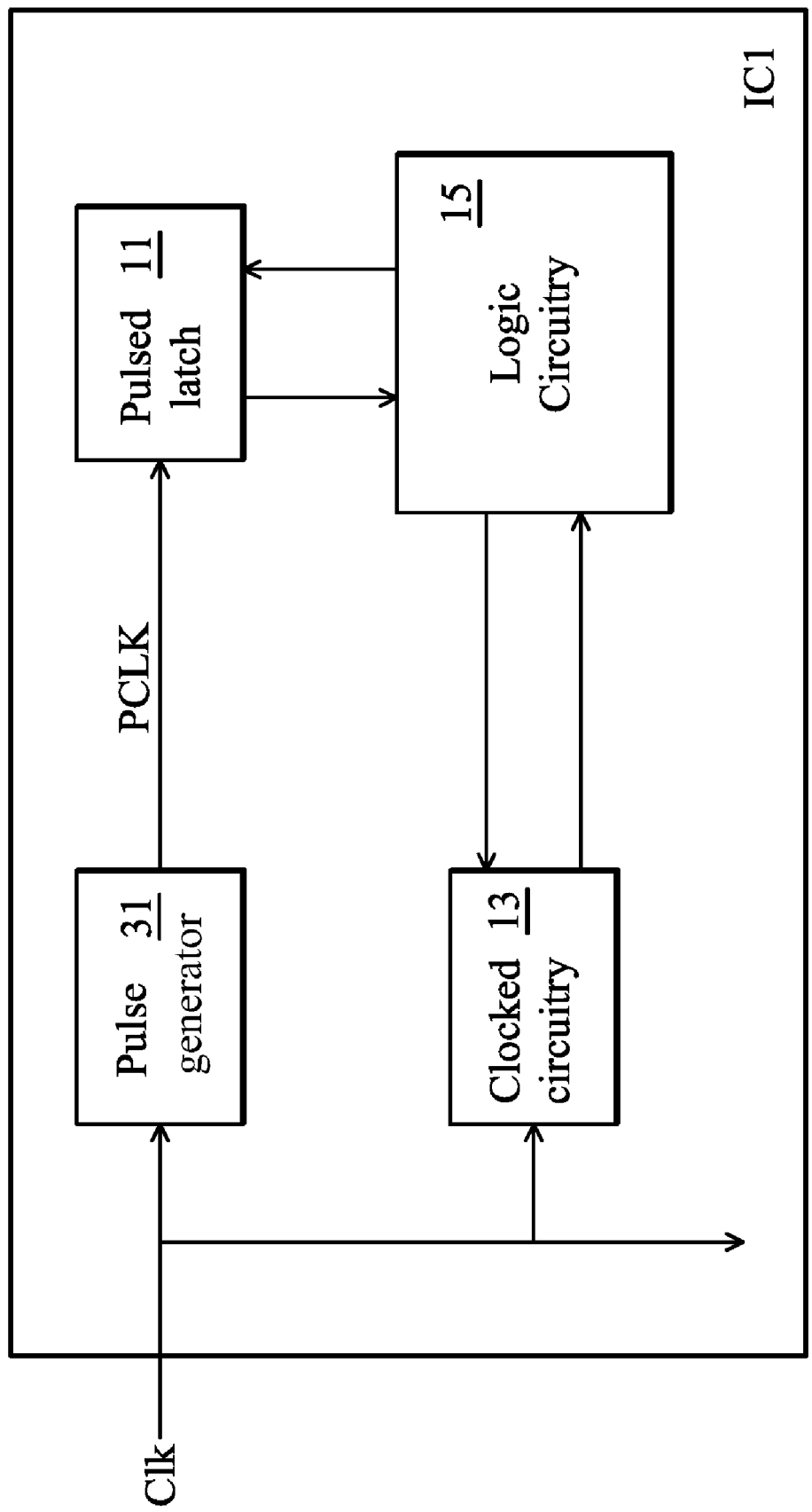
FIG. 10 depicts, in a block diagram view, an exemplary embodiment of an integrated circuit incorporating the features of the invention.

FIG. 10 depicts in a simple block diagram an integrated circuit IC1 where the exemplary embodiment pulse generator 31, described above, is applied. A clock input signal CLK is received as an input and is coupled to the pulse generator 31 and clocked circuitry 13. The clocked circuitry 13 may include, as non-limiting examples, memory, processors, digital signal processors, flash memory, embedded DRAMs, embedded SRAMs, analog to digital circuitry, analog front ends, transceivers and the like. The pulse generator 31 also is coupled to at least one, and typically several, pulsed latch circuits 11 for storing data. These pulsed latch circuits may also be coupled to logic circuitry 15, and to the clocked circuitry. As a non-limiting example, pulsed latch circuitry 11 and logic circuitry 15 could form a state machine, a counter, shift register, ALU, or the like.

Although exemplary embodiments of the present invention and its advantages have been described in detail, it should be understood that various changes, substitutions and alterations can be made herein without departing from the spirit and scope of the invention as defined by the appended claims. For example, it will be readily understood by those skilled in the art that the methods may be varied while remaining within the scope of the present invention.

Moreover, the scope of the present invention is not intended to be limited to the particular embodiments of the methods and steps described in the specification. As one of ordinary skill in the art will readily appreciate from the disclosure of the present invention, processes or steps, presently existing or later to be developed, that perform substantially the same function or achieve substantially the same result as the corresponding embodiments described herein may be utilized according to the present invention. Accordingly, the appended claims are intended to include within their scope such processes or steps

What is claimed is:

1. An apparatus, comprising:
    a variable pulse generator for outputting a pulsed clock signal having a desired duty cycle responsive to an input clock signal, and having a control signal input;
    a pulse monitor circuit for outputting a monitor output corresponding to a timing relationship between the input clock signal and the pulsed clock signal; and
    a pulse width control circuit coupled to receive the monitor output and outputting the control signal input in response to a pattern on the monitor output;
    wherein the width of a high portion of the desired duty cycle of the pulsed clock signal varies according to the value of the control signal input.

2. The apparatus of claim 1, wherein the desired duty cycle has a non-zero high portion that is less than 40% of the total clock cycle of the pulsed clock signal.

3. The apparatus of claim 1, wherein the desired duty cycle has a non-zero high portion that is greater than 10% and less than 40% of the total clock cycle of the pulsed clock signal.

4. The apparatus of claim 1, wherein the monitor output further comprises a plurality of bits.

5. The apparatus of claim 4, wherein the monitor output comprises four bits.

6. The apparatus of claim 1, wherein the pulse monitor circuit further comprises:
    a plurality of delay lines in series, each outputting a delayed pulsed clock signal response to the pulsed clock signal; and
    a plurality of pulse sensor circuits, each coupled to receive one of the delayed pulsed clock signals, and outputting an output signal corresponding to a sample of the input clock signal sampled by the delayed pulsed clock signal;
    wherein the monitor output is a pattern formed from the output signals of the pulse sensor circuits.

7. The apparatus of claim 6, wherein the pulse sensor circuits further comprise:
    a transmission gate coupled to a delayed input clock signal and controlled by a delayed pulsed clock signal and outputting a sample of the delayed input clock signal;
    a recirculating latch circuit coupled to the sampled input clock signal, comprising a first logic element coupled in series to a second logic element for maintaining an output value, and operable to receive the sample of the delayed input clock signal; and
    a reset input for placing the recirculating latch circuit into a known state.

8. The apparatus of claim 1, and further comprising a plurality of pulsed latch circuits clocked by the pulsed clock signal output by the variable pulse generator.

9. An integrated circuit, comprising:
    logic circuitry coupled to perform a user defined logic function;
    at least one pulsed latch circuit coupled to the logic circuitry and configured to store a value, responsive to a pulsed clock signal; and
    a pulsed clock generator for outputting the pulsed clock signal responsive to an input clock signal, operable to adaptively compensate the pulsed clock signal to maintain a desired duty cycle using a feedback loop comprising a pulse monitor circuit that outputs a monitor output signal, and a pulse control circuit operable to control the duty cycle of the pulsed clock signal responsive to the monitor output signal;

wherein the pulsed clock signal has a high portion that varies responsive to the pulse control circuit.

10. The integrated circuit of claim 9, wherein the desired duty cycle has a non-zero high portion that is less than 40% of the total clock cycle of the pulsed clock signal.

11. The integrated circuit of claim 9, wherein the desired duty cycle has a non-zero high portion that is less than 30% of the total clock cycle of the pulsed clock signal.

12. The integrated circuit of claim 9, wherein the desired duty cycle has a non-zero high portion that is greater than 20% and less than 40% of the total clock cycle of the pulsed clock signal.

13. The integrated circuit of claim 9, wherein the pulse monitor circuit further comprises a plurality of delay lines in series, each outputting a delayed pulsed clock signal response to the pulsed clock signal; and a plurality of pulse sensor circuits each coupled to receive one of the delayed pulsed clock signals, and outputting an output signal corresponding to a sample of the input clock signals sampled by the delayed pulsed clock signal;

wherein the monitor output is a pattern formed from the output signals of the pulse sensor circuits.

14. The integrated circuit of claim 13, wherein the pulse sensor circuits further comprise:

a transmission gate coupled to a delayed input clock signal and controlled by a delayed pulsed clock signal and outputting a sample of the delayed input clock signal;

a recirculating latch circuit coupled to the sampled input clock signal, comprising a first logic element coupled in series to a second logic element for maintaining an output value, and operable to receive the sample of the delayed input clock signal; and a reset input for placing the recirculating latch circuit into a known state.

15. The integrated circuit of claim 9, wherein the pulsed clock signal is output by a variable pulse generator in response to a control signal output by the pulse control circuit.

16. A method, comprising:

receiving an input clock signal;

outputting a pulsed clock signal responsive to the input clock signal, having a pulse width corresponding to a control signal;

forming a plurality of delayed pulsed clock signals;

sampling the input clock with the delayed pulsed clock signals to form a monitor output;

comparing the monitor output to a desired monitor output in a pulse monitor circuit; and adjusting the control signal if the monitor output does not match the desired monitor output.

17. The method of claim 16, wherein sampling the input clock with the delayed pulsed clock signals further comprises:

for each delayed pulsed clock signal:

coupling a recirculating latch to a transmission gate, the recirculating latch having an output;

coupling the transmission gate to sample the input clock signal responsive to the corresponding delayed pulsed clock signal; and forming a monitor output from the outputs of the recirculation latches.

18. The method of claim 16, wherein outputting a pulsed clock signal further comprises:

coupling the input clock signal to a variable pulse generator;

coupling the control signal to the variable pulse generator; and varying the width of the pulsed clock signal output by the variable pulse generator by varying the control signal.

19. The method of claim 18, and further comprising:

determining that the monitor output does match a desired monitor output; and removing power from the pulse monitor circuit.

* * * * *